US 8,981,510 B2

(12) United States Patent
Chuang et al.

(10) Patent No.: US 8,981,510 B2
(45) Date of Patent: Mar. 17, 2015

(54) RIDGE STRUCTURE FOR BACK SIDE ILLUMINATED IMAGE SENSOR

(75) Inventors: Chun-Chieh Chuang, Tainan (TW);
Dun-Nian Yaung, Taipei (TW);
Jen-Cheng Liu, Hsin-Chu (TW);
Keng-Yu Chou, Kaoshiung (TW);
Wen-De Wang, Minsyong Township, Chiayi County (TW); Pao-Tung Chen, Tainan Hsien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 269 days.

(21) Appl. No.: 12/794,101

(22) Filed: Jun. 4, 2010

(65) Prior Publication Data

US 2011/0298072 A1  Dec. 8, 2011

(51) Int. Cl.
*H01L 31/0232* (2014.01)
*H01L 27/146* (2006.01)

(52) U.S. Cl.
CPC ........ *H01L 27/1464* (2013.01); *H01L 27/1462* (2013.01); *H01L 27/14621* (2013.01); *H01L 27/14627* (2013.01); *H01L 27/14643* (2013.01); *H01L 27/14685* (2013.01); *H01L 27/14689* (2013.01); *H01L 27/1463* (2013.01)
USPC ............ 257/432; 257/436; 257/437; 257/447

(58) Field of Classification Search
USPC ......... 257/432, 436, 437, 440, 443, 447, 460, 257/E27.134, E27.159, E31.127; 438/60, 438/66, 70, 72, 73, 80
See application file for complete search history.

(56) References Cited

U.S. PATENT DOCUMENTS

| | | | |
|---|---|---|---|
| 7,443,005 B2 * | 10/2008 | Kuo et al. | 257/432 |
| 2006/0189062 A1 | 8/2006 | Deng et al. | |
| 2008/0061330 A1 * | 3/2008 | Shiau et al. | 257/294 |
| 2008/0087921 A1 * | 4/2008 | Yu et al. | 257/213 |
| 2009/0242951 A1 * | 10/2009 | Ueno et al. | 257/292 |
| 2009/0273008 A1 * | 11/2009 | Moon | 257/225 |
| 2010/0006969 A1 * | 1/2010 | Park et al. | 257/446 |
| 2011/0266645 A1 | 11/2011 | Chao | |

OTHER PUBLICATIONS

T. H. Hsu et al., "Dramatic reduction of optical crosstalk in Deep-submicrometer CMOS imager with air gap guard ring", IEEE Electron Device Letters, vol. 25, No. 6, Jun. 2004, pp. 375-377.*

* cited by examiner

*Primary Examiner* — Andy Huynh
*Assistant Examiner* — Sitaramarao S Yechuri
(74) *Attorney, Agent, or Firm* — Haynes and Boone, LLP

(57) ABSTRACT

Provided is an image sensor device. The image sensor device includes a substrate having a front side and a back side. The image sensor includes first and second radiation-detection devices that are disposed in the substrate. The first and second radiation-detection devices are operable to detect radiation waves that enter the substrate through the back side. The image sensor also includes an anti-reflective coating (ARC) layer. The ARC layer is disposed over the back side of the substrate. The ARC layer has first and second ridges that are disposed over the first and second radiation-detection devices, respectively. The first and second ridges each have a first refractive index value. The first and second ridges are separated by a substance having a second refractive index value that is less than the first refractive index value.

20 Claims, 9 Drawing Sheets

US 8,981,510 B2

RIDGE STRUCTURE FOR BACK SIDE ILLUMINATED IMAGE SENSOR

TECHNICAL FIELD

The present disclosure relates generally to a semiconductor device, and more particularly, to a semiconductor image sensor device.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

A back side illuminated (BSI) image sensor device is one type of image sensor device. Some existing BSI image sensor fabrication processes suffer from high levels of optical cross-talk noise. Optical cross-talk noise degrades the performance of the BSI image sensor devices and is therefore undesirable. Other existing BSI image sensor fabrication processes may have somewhat acceptable optical cross-talk noise, but may result in low levels of quantum efficiency instead. A low quantum efficiency is correlated to a low signal-to-noise ratio of the BSI image sensor devices. The low-signal-to-noise ratio manifests itself as poor sensitivity for the BSI image sensor devices, which is also undesirable.

Therefore, while existing methods of fabricating BSI image sensor devices have been generally adequate for their intended purposes, they have not been entirely satisfactory in every aspect.

SUMMARY

One of the broader forms of the present disclosure involves an image sensor device that includes: a substrate having a front side and a back side; first and second radiation-detection devices disposed in the substrate, the first and second radiation-detection devices being operable to detect radiation waves that enter the substrate through the back side; and an anti-reflective coating (ARC) layer disposed over the back side of the substrate, the ARC layer having first and second ridges that are disposed over the first and second radiation-detection devices, respectively, the first and second ridges each having a first refractive index value; wherein the first and second ridges are separated by a substance having a second refractive index value that is less than the first refractive index value.

Another of the broader forms of the present disclosure involves an image sensor device that includes: a substrate having a front surface and a back surface; a plurality of radiation-sensing regions formed in the substrate, each of the radiation-sensing regions being operable to sense radiation projected toward the radiation-sensing region through the back surface; and a plurality of anti-reflective features formed over the back surface of the substrate, each of the anti-reflective features being approximately aligned to one of the radiation-sensing regions, each of the anti-reflective features being separated from adjacent anti-reflective features by a material that has a lower refractive index than each of the anti-reflective features.

Still another of the broader forms of the present disclosure involves a method of fabricating an image sensor device, the method includes: providing a substrate having a front surface and a back surface; forming a plurality of radiation-sensing regions in the substrate, each of the radiation-sensing regions being operable to sense radiation projected toward the radiation-sensing region through the back surface; and forming a plurality of anti-reflective features over the back surface of the substrate, each of the anti-reflective features being approximately aligned to one of the radiation-sensing regions, the anti-reflective features being separated by a material that has a lower refractive index than each of the anti-reflective features.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
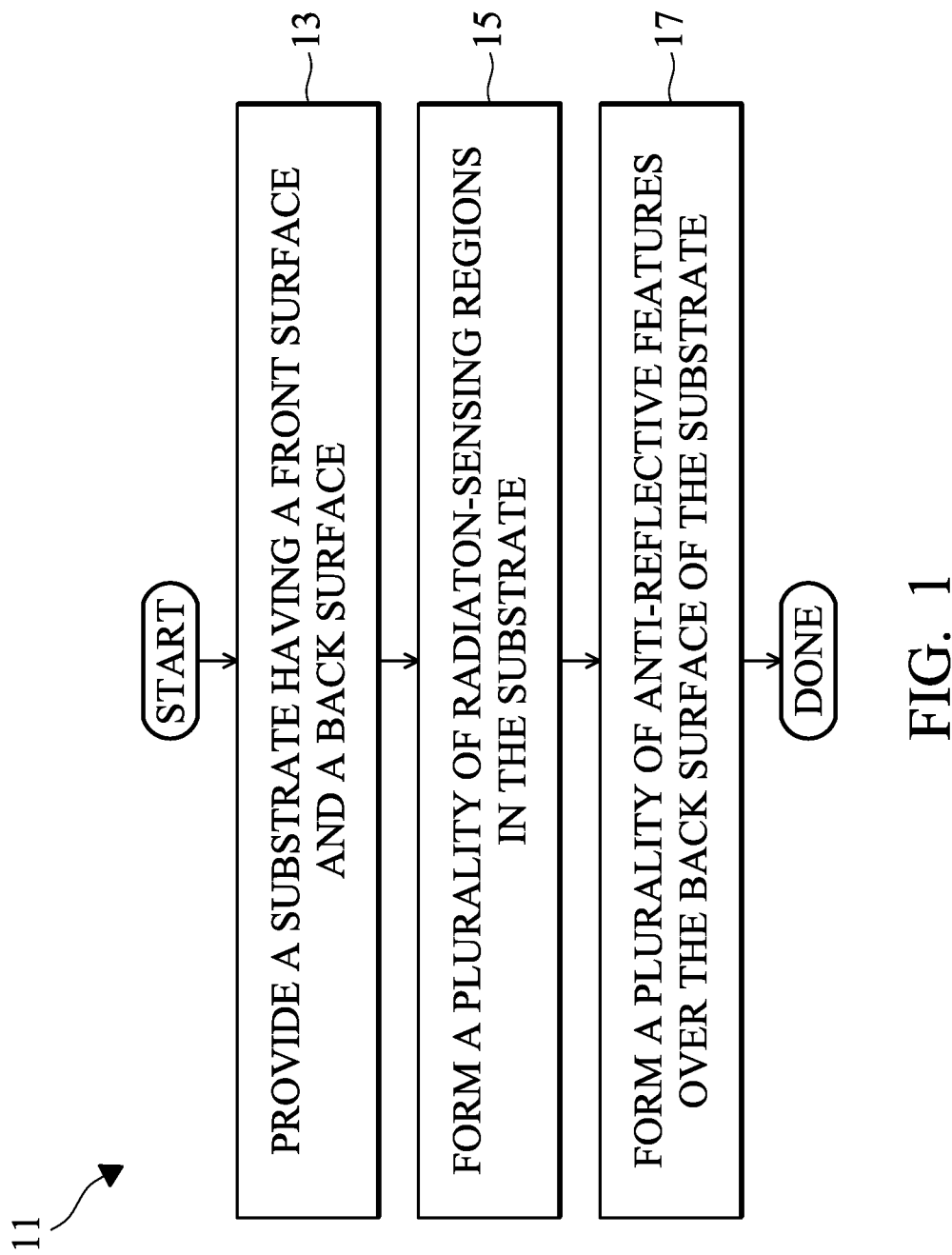
FIG. 1 is a flowchart illustrating a method for fabricating a semiconductor device according to various aspects of the present disclosure.

Illustrated in FIG. 1 is a flowchart of a method 11 for fabricating a back-side illuminated (BSI) image sensor device according to various aspects of the present disclosure. Referring to FIG. 1, the method 11 begins with block 13 in which a substrate having a front surface and a back surface is provided. The method 11 continues with block 15 in which a plurality of radiation-sensing regions is formed in the substrate. Each of the radiation-sensing regions is operable to sense radiation projected toward the radiation-sensing region from the back surface. The method 11 continues with block 17 in which a plurality of anti-reflective features is formed over the back surface of the substrate. Each of the anti-reflective features is approximately aligned to one of the radiation-sensing regions. Each of the anti-reflective features is separated from adjacent anti-reflective features by a material that has a lower refractive index than each of the anti-reflective features.

FIGS. 2 to 6 are diagrammatic fragmentary cross-sectional side views of a BSI image sensor device 30 at various stages of its fabrication according to an embodiment of the method 11 of FIG. 1. It is understood that FIGS. 2 to 6 have been simplified for a better understanding of the inventive concepts of the present disclosure.

Figure 2:
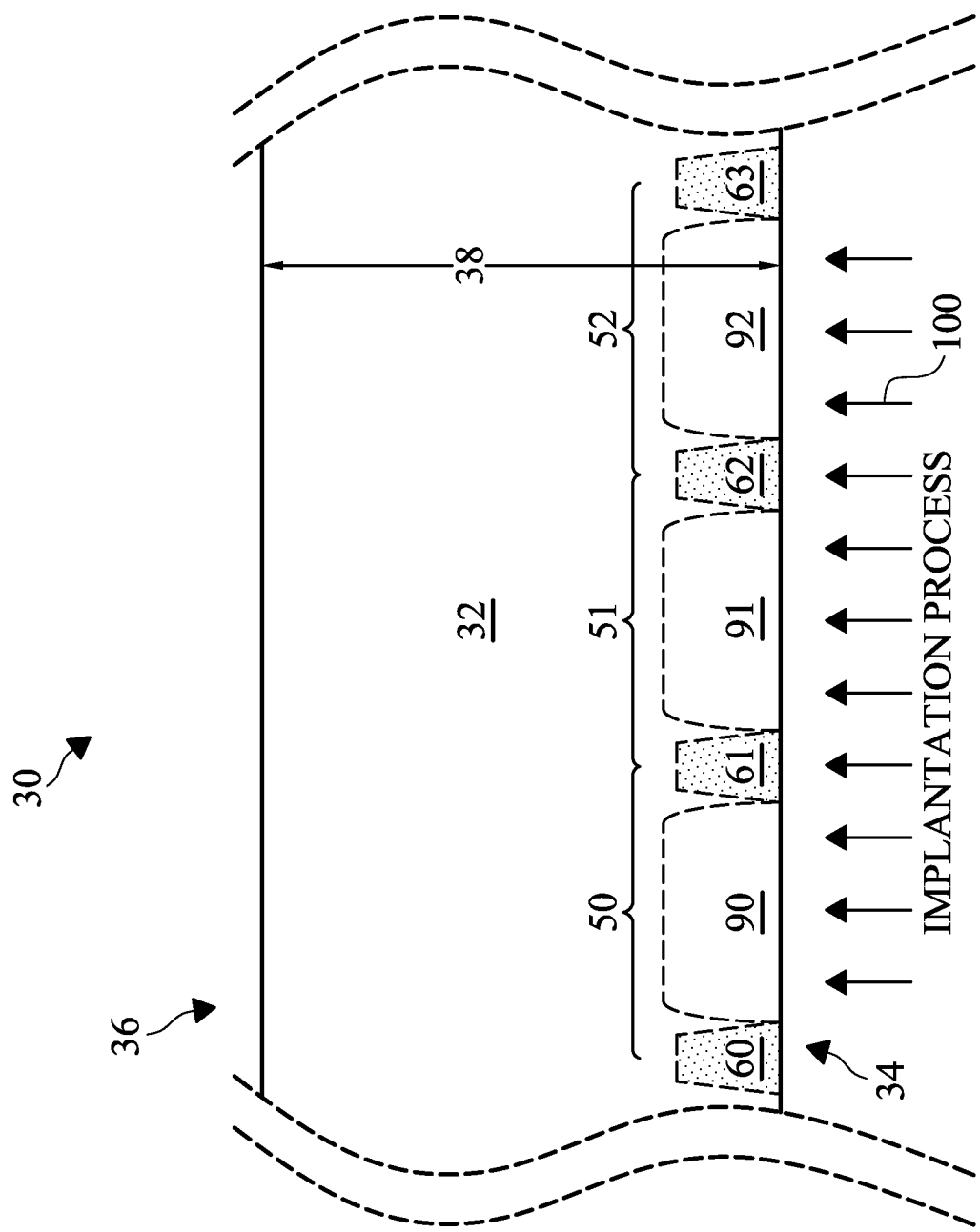
FIGS. 2-7 are diagrammatic fragmentary cross-sectional side views of a semiconductor device at various stages of fabrication in accordance with an embodiment of the method illustrated in FIG. 1.

Referring to FIG. 2, the BSI image sensor device 30 includes a substrate 32, also referred to as a device substrate. The substrate 32 is a silicon substrate doped with a P-type dopant such as boron, in which case the substrate 32 is a P-type substrate. Alternatively, the substrate 32 could be another suitable semiconductor material. For example, the substrate 32 may be a silicon substrate that is doped with an N-type dopant such as phosphorous or arsenic, in which case the substrate 32 is an N-type substrate. The substrate 32 may include other elementary semiconductors such as germanium. The substrate 32 may optionally include a compound semiconductor and/or an alloy semiconductor. Further, the substrate 32 may include an epitaxial layer (epi layer), may be strained for performance enhancement, and may include a silicon-on-insulator (SOI) structure.

The substrate 32 has a front side 34 and a back side 36. To facilitate the ensuing discussions, the substrate 32 is as being vertically "flipped upside down". In other words, the substrate 32 is shown such that the back side 36 is shown above the front side 34 in FIG. 2. The front side 34 may also be referred to as a front surface, and the back side 36 may also be referred to as a back surface. The substrate 32 has an initial thickness 38 that is in a range from approximately 100 microns (um) to approximately 3000 um. In an embodiment, the initial thickness 38 is approximately 700 um.

The substrate 32 includes various regions, which may include a pixel-array region, a periphery region, a bonding pad region, and a scribe line region. The pixel-array region contains arrays of radiation-sensing pixels. Each pixel may include a radiation-sensing device that can sense or detect radiation having specific wavelengths, which may correspond to lights of different colors. The periphery region includes devices that need to be kept optically dark. These devices may be digital devices, such as application-specific integrated circuit (ASIC) devices or system-on-chip (SOC) devices. The devices in the periphery region may also be reference pixels that are used to establish a baseline of an intensity of light for the image sensor device 30.

The bonding pad region is where one or more bonding pads of the image sensor device 30 will be formed. The bonding pads allow electrical connections to be established between the image sensor device 30 and external devices. The scribe line region includes regions that contain boundaries between various adjacent semiconductor dies. The scribe line region is cut therethrough in a later fabrication process to physically separate these adjacent dies, before the dies are packaged and sold as integrated circuit chips. For the sake of simplicity, the periphery region, the bonding pad region, and the scribe line region are not illustrated, and only a portion of the pixel-array region is illustrated in FIG. 2. Specifically, FIG. 2 illustrates three example pixels 50, 51, and 52 of the pixel-array region. It is understood, however, that any number of pixels may be implemented in the pixel-array region, and that these other pixels may be implemented differently from the example pixels 50-52. The approximate boundaries of the portion of the pixel-array region having these pixels 50-52 are shown as broken curved lines illustrated in FIG. 2.

Isolation structures 60, 61, 62, and 63 are formed in the substrate 32 to define approximate boundaries of each of the pixels 50-52. For example, the isolation structures 60 and 61 define the approximate boundaries of the pixel 50. The isolation structures 60-63 include shallow trench isolation (STI) features. The isolation structures 60-63 may alternatively include deep trench isolation features or doped isolation features. It is also understood that the isolation structures 60-63 may each include a suitable combination of STI features, deep trench isolation features, and doped isolation features.

In an embodiment where the isolation structures 60-63 are STI features or deep trench isolation features, they are formed by etching openings (or trenches) from the front side 34 of the substrate 32 and thereafter filling the openings with a dielectric material, such as an oxide material or a nitride material, or combinations thereof. Although not illustrated for the sake of simplicity, the isolation structures 60-63 may each be surrounded by a doped well, which may have the same doping polarity as the substrate 32. Stated differently, if the substrate 32 is doped with a P-type dopant, then the doped wells are also doped with a P-type dopant, and vice versa. In another embodiment where the isolation structures 60-63 include doped isolation features, these doped isolation features may be formed by doping the substrate from the front side 34 using a dopant that has an opposite doping polarity as the substrate 32. Thus, if the substrate 32 is a P-type substrate, the dopant used to form the doped isolation features is an N-type dopant.

Radiation-sensing regions (or devices) 90, 91, and 92 are then formed in the pixels 50, 51, and 52, respectively. The radiation-sensing regions 90-92 are formed between the isolation structures 60-61, 61-62, and 62-63, respectively. The radiation-sensing regions 90-92 may be formed by performing an ion implantation process 100 on the substrate 32 from the front side 34. The ion implantation process 100 may include multiple implant steps and may use different dopants, dosages, and implantation energies. Each dopant of the implantation process 100 includes a plurality of ions, for example boron ions (P-type), arsenic ions (N-type), or phosphorous ions (N-type). In an embodiment, the ion implantation process 100 includes doping the substrate 32 with a dopant having an opposite doping polarity as the substrate 32. For example, if the substrate 32 a P-type substrate, the radiation-sensing regions 90 may be doped with an N-type dopant. If the substrate 32 is an N-type substrate, the radiation-sensing regions 90 may be doped with a P-type dopant. It is also understood that the ion implantation process 100 may use different masks that have different mask patterns and mask opening sizes.

In the embodiment shown in FIG. 2, the radiation-sensing regions 90-92 are formed adjacent to or near the front side 34 of the substrate 32. In alternative embodiments, depending on the design needs and manufacturing requirements, the radiation-sensing regions 90-92 may be formed further away from the front side 34. The position or location of the radiation-sensing regions 90-92 may be adjusted by tuning an implantation energy level of the implantation process 100. For example, a higher implantation energy level results in a deeper implant, which means the radiation-sensing regions 90-92 are formed further away from the front side 34. Similarly, a smaller implantation energy level causes the radiation-sensing regions 90-92 to be formed closer to the front side 34.

The radiation-sensing regions 90-92 are each operable to sense or detect radiation waves projected toward the radiation-sensing regions 90-92 through the back side 36 of the substrate 32. The radiation-sensing regions 90-92 may intend to sense radiation waves having different wavelengths, which may correspond to light having different colors. For example, the radiation-sensing region 90 may intend to sense a blue light, the radiation-sensing region 91 may intend to sense a green light, and the radiation-sensing region 92 may intend to sense a red light.

In one embodiment, the radiation-sensing regions 90-92 each include a standard photodiode. In another embodiment, the radiation-sensing regions 90-92 each include a pinned photodiode. In other embodiments, the radiation-sensing regions 90-92 may each include other types of photodiodes, photogates, reset transistors, source follower transistors, or transfer transistors. For the sake of simplicity, the structural details of the radiation-sensing regions 90-92 are not illustrated.

During the operation of the image sensor device 30, noise such as cross-talk may occur. For example, optical cross-talk occurs when photons from the radiation waves that are intended to be received by the pixel 51 end up being received by the pixels 50 or 52. Such operation is unintended. Left unabated, optical cross-talk will degrade the performance of the image sensor device 30. Here, the isolation structures 60-63 serve to isolate the pixels 50-52 from one another and therefore reduce optical cross-talk to an extent. However, the amount of optical cross-talk reduction achieved by the isolation structures 60-63 may not be sufficient, particularly as device geometries become increasingly small. The embodiments disclosed herein address the optical cross-talk issue in an effective manner, as will be discussed in more detail below.

Figure 3:
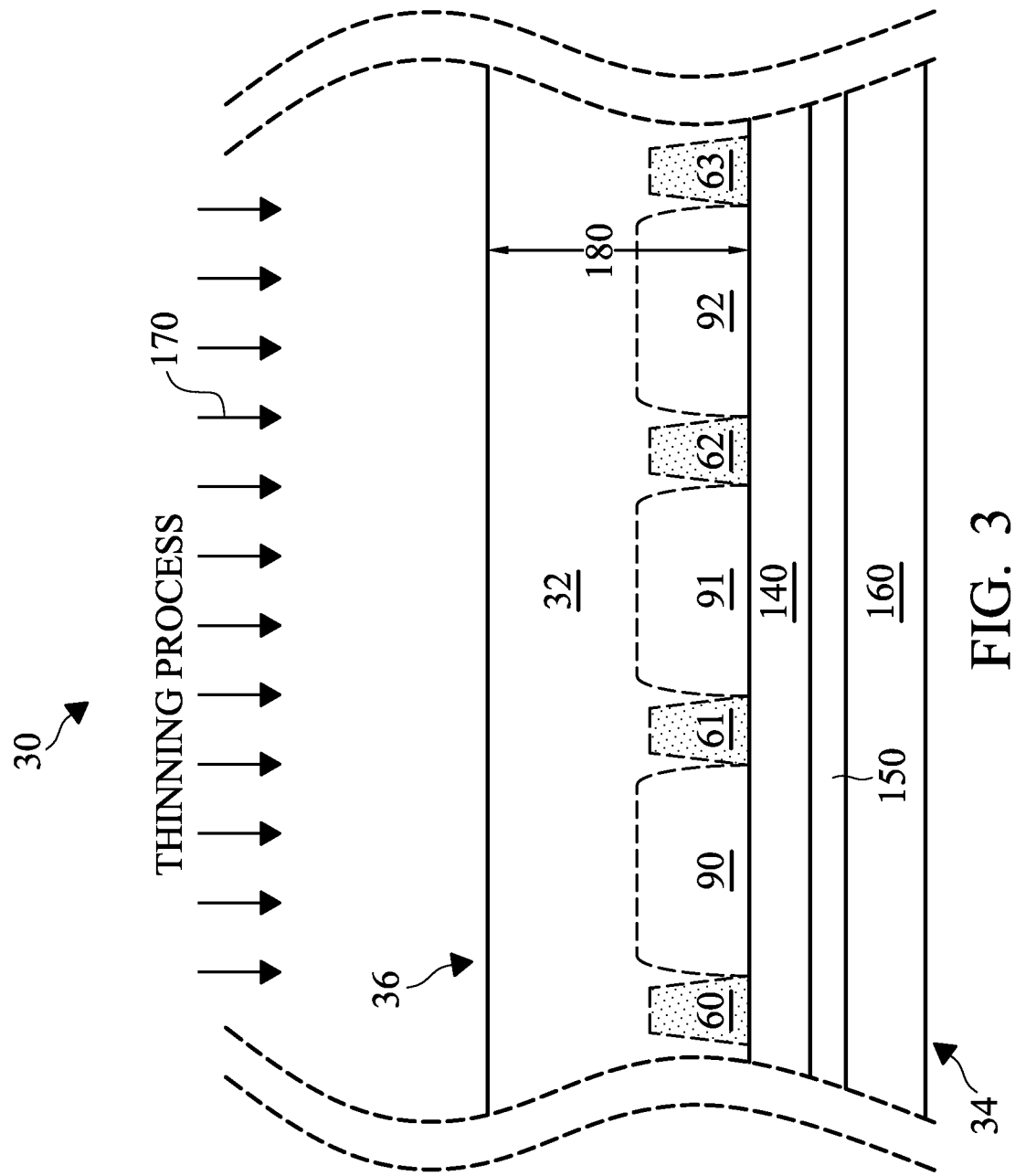

Referring now to FIG. 3, an interconnect structure 140 is formed over the front side 34 of the substrate 32. The interconnect structure 140 includes a plurality of patterned dielectric layers and conductive layers that provide interconnections (e.g., wiring) between the various doped features, circuitry, and input/output of the image sensor device 30. The interconnect structure 140 includes an interlayer dielectric (ILD) and a multilayer interconnect (MLI) structure formed in a configuration such that the ILD separates and isolates each MLI structure from other MLI structures. The MLI structure includes contacts, vias and metal lines formed on the substrate 32.

In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

A buffer layer 150 is formed on the interconnect structure 140. In an embodiment, the buffer layer 150 includes a dielectric material such as silicon oxide. Alternatively, the buffer layer 150 may optionally include silicon nitride. The buffer layer 150 is formed by CVD, PVD, or other suitable techniques. The buffer layer 150 is planarized to form a smooth surface by a chemical-mechanical-polishing (CMP) process.

A carrier substrate 160 is then bonded with the buffer layer 150 so that processing of the back side 36 of the substrate 32 can be performed. The carrier substrate 160 is bonded to the buffer layer 150 by molecular forces. The carrier substrate 160 may be similar to the substrate 32 and includes a silicon material. Alternatively, the carrier substrate 160 may optionally include a glass material. The carrier substrate 160 provides protection for the various features formed on the front side 34 of the substrate 32. The carrier substrate 160 also provides mechanical strength and support for processing the back side 36 of the substrate 32, which will be discussed below. It is understood that an annealing process may optionally be performed to enhance bonding strength. The buffer layer 150 provides electrical isolation between the substrate 32 and the carrier substrate 160.

Thereafter, a thinning process 170 (also referred to as a thin down process) is performed to thin the substrate 32 from the back side 36 to a suitable thickness. In an embodiment, the thinning process 170 includes a CMP process. The thinning process 170 may also include a diamond scrubbing process, a grinding process, or other suitable techniques. A substantial amount of material may be removed from the substrate 32 by the thinning process 170. After the thinning process 170 is performed, the substrate 32 has a thickness 180, which is in a range from approximately 1 um to approximately 6 um.

Figure 4:
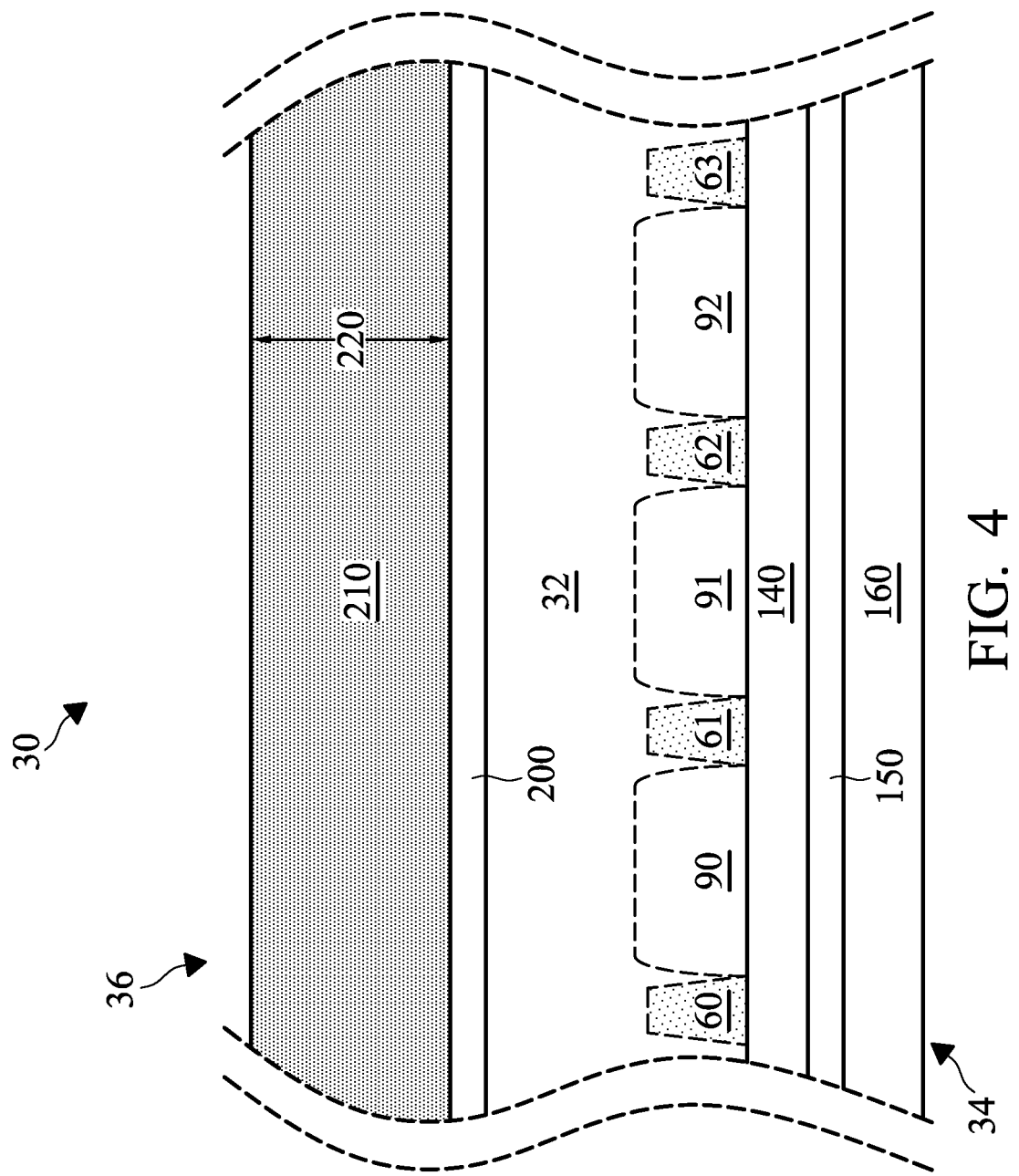

Referring now to FIG. 4, a dielectric layer 200 is optionally formed over the back side 36 of the substrate 32. The dielectric layer 200 includes a silicon oxide material in the present embodiment, but may include another transparent material in alternative embodiments.

Thereafter, an anti-reflective coating (ARC) layer 210 is formed over the dielectric layer 200 (or over the back side 36 of the substrate 32 if the dielectric layer 200 is not formed). The ARC layer 210 is formed using a CVD process in the present embodiment, but may be formed using another suitable process alternative embodiments. The ARC layer 210 has a refractive index value (n) that is in a range from approximately 1.4 to approximately 3. In another embodiment, the ARC layer 210 may have a refractive index value that is in a range from approximately 1.8 to approximately 2.6.

In general, the refractive index value of a medium measures how much the speed of a wave—such as light or sound—is reduced when the wave is propagating (traveling) inside the medium in comparison to the speed of the wave propagating in a vacuum. For example, if a medium has a refractive index value of 2 for light, then light in the medium propagates at ½ or 0.5 times the speed of light in a vacuum. The refractive index value for a particular medium is also dependent on the wavelength or frequency of the wave. For the discussions regarding the present embodiment, the refractive index values discussed herein refer to the refractive index values of the respective media with respect to visible light. It is understood, however, that in real world operations, the BSI image sensor device 30 may be capable of sensing non-visible light, including infrared or ultraviolet light.

The ARC layer 210 also has a low extinction coefficient (k). In an embodiment, the extinction coefficient is less than approximately 0.2, and may be as small as 0.001. The extinction coefficient measures how much a material such as the ARC layer 210 absorbs radiation at a given wavelength. Here, the given wavelength is approximately in the range of visible light. Due to the small extinction coefficient, the ARC layer 210 is highly absorptive of light and does not reflect much light.

To satisfy the refractive index and extinction coefficient requirements, the ARC layer 210 may include a material that is one of the following: ultraviolet silicon nitride, silicon oxynitride, silicon carbide, silicon carbide nitride, titanium oxide, and hafnium oxide. The ARC layer 210 also has a thickness 220 that is in a range from approximately 100 angstroms to approximately 1500 angstroms. It is understood that in alternative embodiments, the ARC layer 210 may include another suitable material that meets the above refractive index value and extinction coefficient requirements. The ARC layer in alternative embodiments may also have a different thickness.

Figure 5:
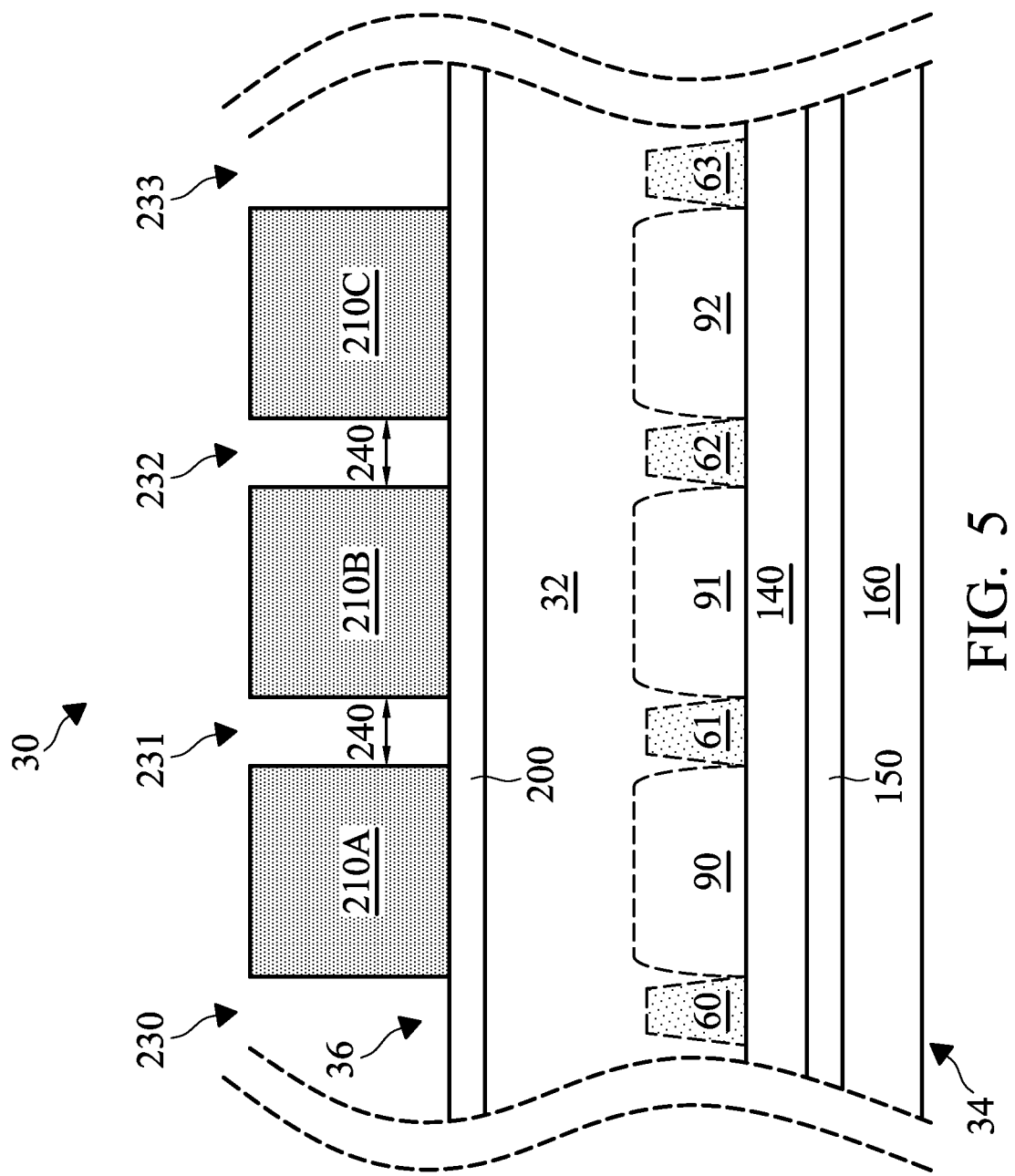

Referring now to FIG. 5, openings 230, 231, 232, and 233 are formed in the ARC layer 210. The openings 230-233 may be formed by a suitable etching process. The openings 231-232 each include a width 240 that is defined in a horizontal direction. In an embodiment, the width 240 is in a range from approximately 0.05 um to approximately 0.8 um.

The ARC layer 210 is divided into anti-reflective features 210A, 210B, and 210C by the openings 230-233. In an embodiment, the anti-reflective features 210A-210C are approximately vertically aligned with the radiation-sensing regions 90-92, respectively.

Figure 6:
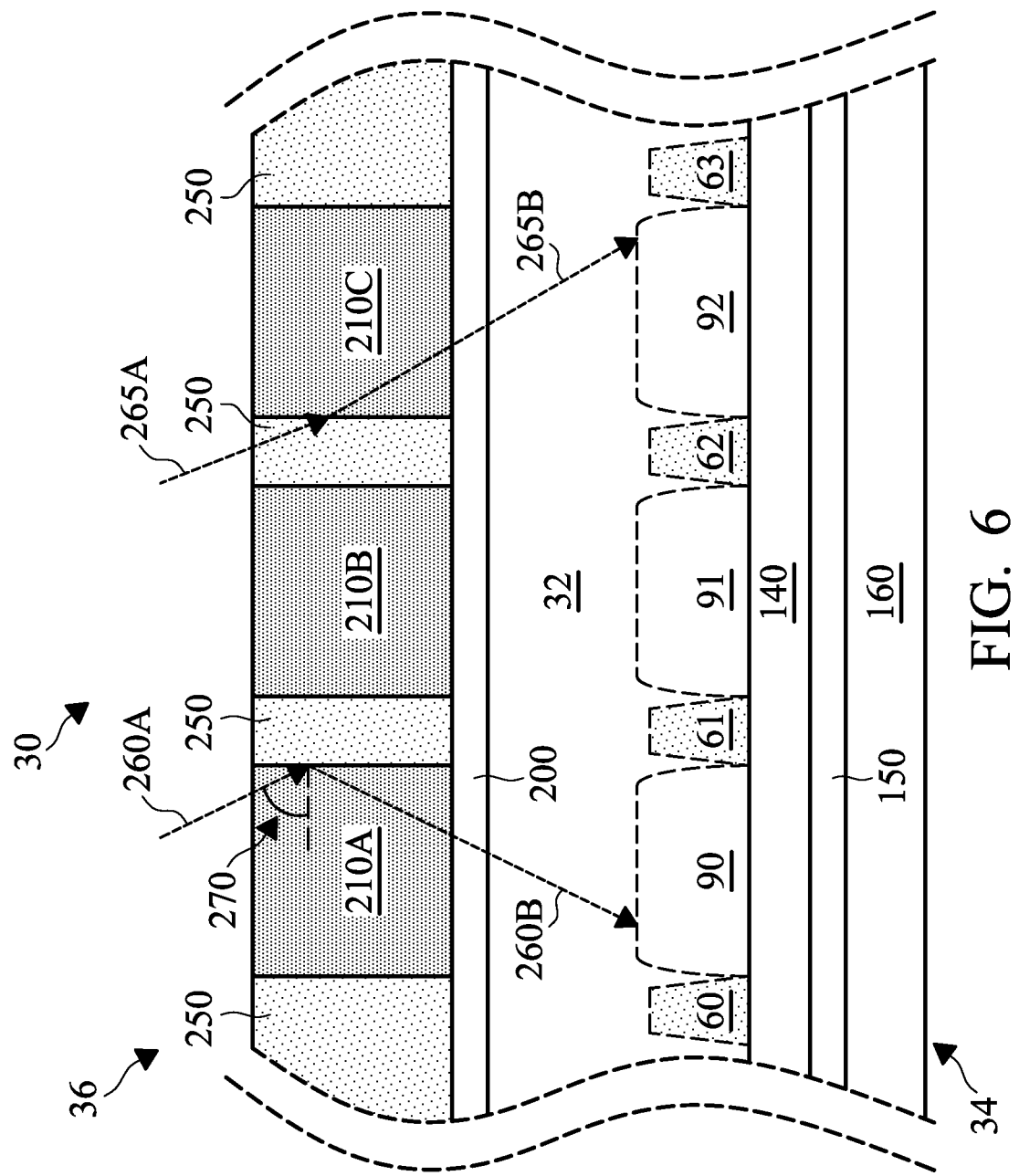

Referring now to FIG. 6, a substance 250 is formed over the back side 36 to fill the openings 230-233 (shown in FIG. 5). The substance 250 has a refractive index value that is less than the refractive index value of the anti-reflective features 210A-210C. In an embodiment, the refractive index value of the substance 250 is in a range from approximately 1 to approximately 1.5. For example, the substance 250 may include silicon oxide, which has a refractive index value of approximately 1.46.

The discussions of the next few paragraphs pertain to the relevant laws of optics, which will help facilitate an understanding of the inventive concepts contained in the present disclosure. Suppose a wave (referred to as incident wave) is propagating from a first medium to a second medium. At the junction (or interface) between the two media, typically a portion of the wave (referred to as a reflected wave) is reflected back toward the first medium, and another portion of the wave (referred to as a refracted wave) is refracted into the second medium. The incident wave forms an angle of incidence with an axis perpendicular to the junction. The refracted wave forms an angle of refraction with the axis perpendicular to the junction. If the two media have different refractive index values, then the angle of incidence is not equal to the angle of refraction. To an observer, the wave will appear to be "bent" as it continues propagation inside the second medium.

The relationship between the refractive index values of the respective media and the angles of incidence and refraction is governed by Snell's law of refraction, defined as follows:

refractive index value of the first medium*sine(angle of incidence)=refractive index value of the second medium*sine(angle of refraction).

When the first medium is optically denser (having a higher refractive index value) than the second medium, and when the angle of incidence exceeds a critical angle, then total internal reflection will occur. Total internal reflection means that all of the incident wave will be reflected at the junction between the two media. Alternatively stated, 100% of the incident wave is reflected back inside the first medium, and no portion will be refracted into the second medium.

To illustrate, FIG. 6 shows a radiation wave 260A and a radiation wave 265A that are projected toward the BSI image sensor device 30 from the back side 36. The radiation wave 260A enters the BSI image sensor device 30 from the anti-reflective feature 210A. As the radiation wave 260A propagates to a junction (or interface) between the anti-reflective feature 210A and the substance 250, an angle of incidence 270 is formed. As discussed above, the substance 250 has a smaller refractive index than the anti-reflective feature 210A. Therefore, according to Snell's law of refraction, when the angle of incidence 270 is greater than a critical angle $\theta_c$, total internal reflection occurs. This means that 100% of the radiation wave 260A will be reflected as radiation wave 260B. The critical angle $\theta_c$ can be calculated using the following equation:

$\theta_c$=arcsin(refractive index value of the substance 250/ refractive index value of the anti-reflective feature 210A)

The reflected radiation wave 260B is eventually absorbed by the appropriate radiation-sensing region 90, which is the intended operation.

Meanwhile, the radiation wave 265A enters the BSI image sensor device 30 from the substance 250. As the radiation wave 265A propagates to the junction between the substance 250 and the anti-reflective feature 210C, it does not reflect back. This is because the refractive index for the substance 250 is less than the refractive index of the anti-reflective feature 210C. Instead, the radiation wave 265A is refracted into the anti-reflective feature 210C as a radiation wave 265B. The radiation wave 265B is eventually absorbed by the appropriate radiation-sensing region 92.

The embodiment disclosed herein offer several advantages over prior art BSI image sensor devices. One of the advantages is reduced optical cross-talk. As discussed above, in prior art BSI image sensor devices, the incident radiation may be unintentionally absorbed by neighboring pixels, which leads to undesirable optical cross-talk. Here, the greater refractive index value of the anti-reflective features 210A-210C in comparison with neighboring materials (such as the substance 250) results in a possibility of total internal reflection of incident radiation. As such, radiation that is intended for one pixel would still be absorbed by the intended pixel. In this manner, optical cross-talk may be substantially reduced.

In addition, the substance 250 is not a reflective material. Thus, even when radiation is incident upon the back surface of the substance 250 (such as the radiation wave 265A), the radiation would still be able to propagate through the substance and be absorbed by a desired pixel, as opposed to being reflected in a direction away from the image sensor. Had the incident radiation been reflected away, it would have resulted in a loss of quantum efficiency. Thus, another advantage offered by the embodiments disclosed herein is improved quantum efficiency, since there is no loss of radiation caused by undesirable reflection. It is understood, however, that these advantages outlined above are not meant to be limiting. Other embodiments may offer different advantages, and no particular advantage is required for any embodiment.

Figure 7:
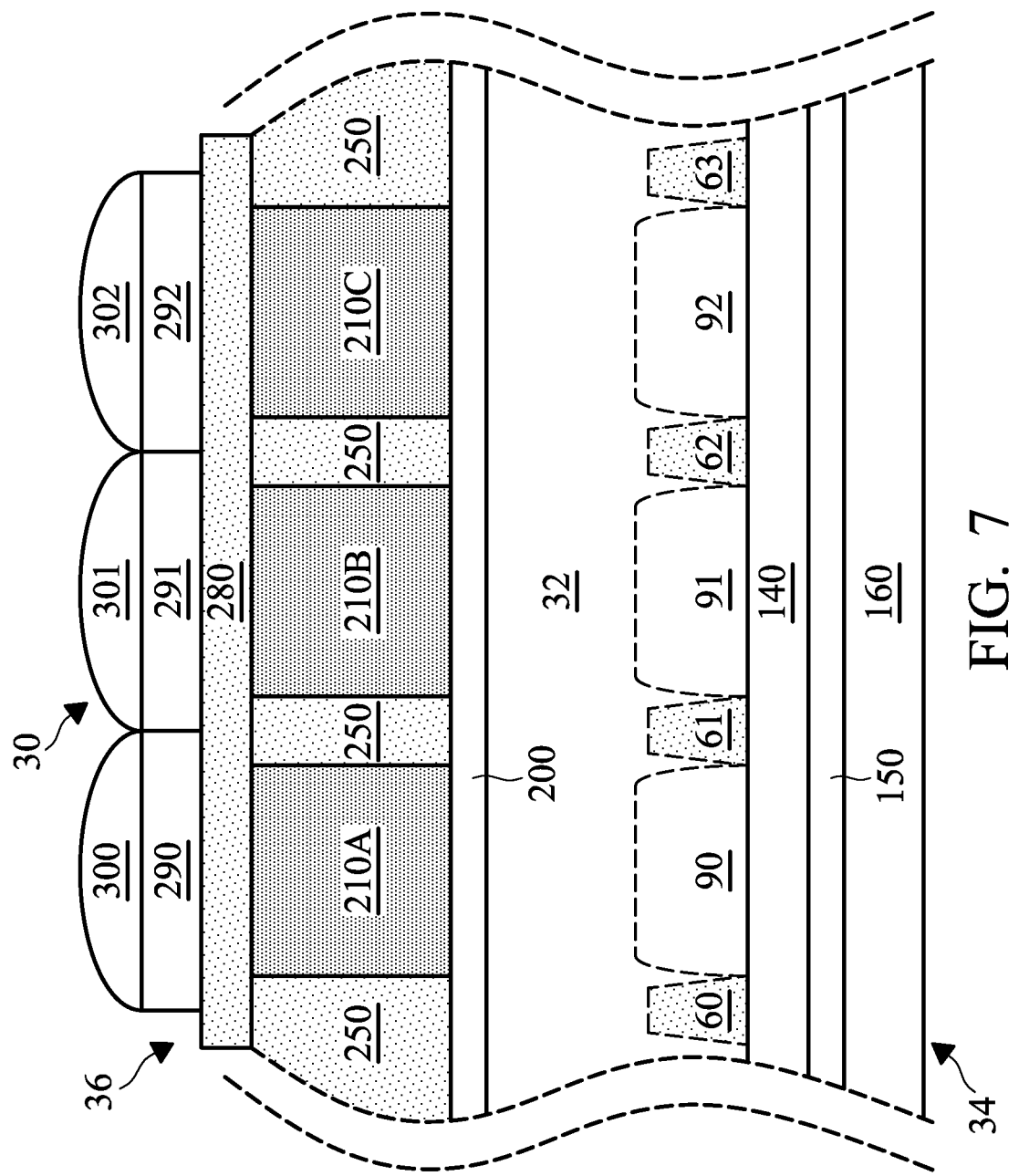

Referring now to FIG. 7, a substance 280 is formed over the back side 36 on the anti-reflective features 210A-210C and the substance 250. The substance 280 is substantially similar to the substance 250 and therefore also has a lower refractive index value than the anti-reflective features 210A-210C. In some embodiments, the substances 250 and 280 are the same material and are formed together using a single deposition process.

Thereafter, color filters 290, 291, and 292 are formed over the substance 280. The color filters 290-292 can each support the filtering of radiation waves having particular ranges of wavelength, which may each correspond to a different light color, for example red, green, or blue (primary colors), or yellow, purple, and magenta (complementary colors). Thus, the color filters 290-292 may each be used to only allow light having a predetermined color to reach the respective radiation-sensing regions 90-92 therebelow. For example, the color filter 290 may only allow a blue light to pass through and be sensed by the radiation-sensing region 90. The color filter 291 may only allow a green light to pass through and be sensed by the radiation-sensing region 91. The color filter 292 may only allow a red light to pass through and be sensed by the radiation-sensing region 92. To achieve the filtering of specific ranges of wavelength, the color filters 290-292 may each include a dye-based (or pigment based) polymer or resin.

Micro lenses 300, 301, and 302 are then formed over the color filters 290, 291, and 292, respectively. The micro lenses 300-302 each help direct projected radiation waves toward the appropriate radiation-sensing regions 90-92 therebelow. The micro lenses 300-302 may each be positioned in various arrangements and have various shapes depending on a refractive index of material used for the micro lenses and distance from the surface of the BSI image sensor device 30.

Further, although not illustrated for the sake of simplicity, it is understood that the BSI image sensor device 30 may include a charge-coupled device (CCD), complimentary metal oxide semiconductor (CMOS) image sensor (CIS), an active-pixel sensor (APS), or a passive-pixel sensor. The BSI image sensor device 30 may further include additional circuitry and input/outputs that are provided adjacent to the pixels (such as the pixels 50, 51, or 52 of FIG. 2) for providing an operational environment for the pixels and for supporting external communication with the pixels.

Figure 8:
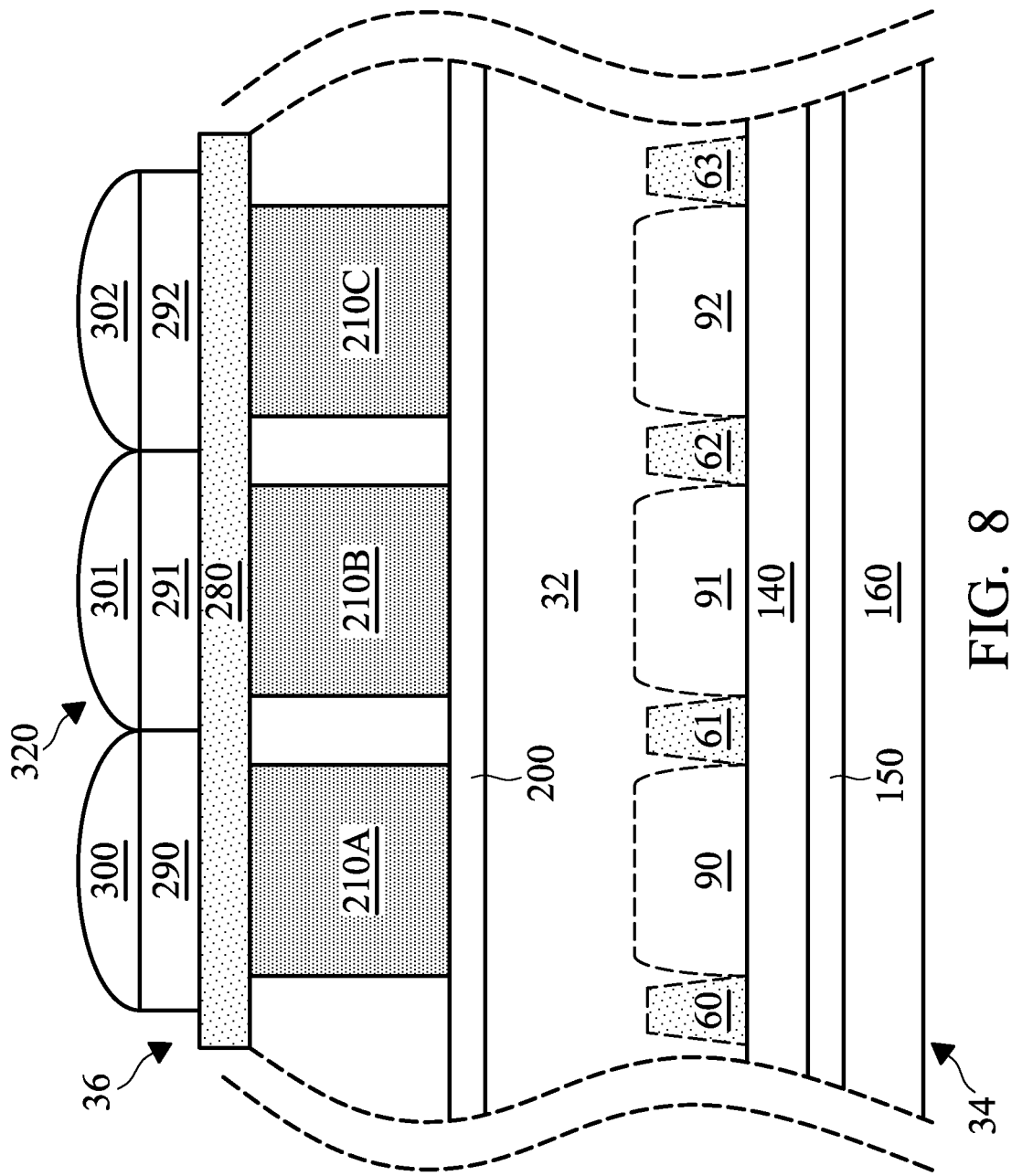
FIG. 8 is a diagrammatic fragmentary cross-sectional side view of a semiconductor device at a stage of fabrication in accordance with an alternative embodiment of the method illustrated in FIG. 1.

FIG. 8 is a diagrammatic fragmentary cross-sectional side view of a BSI image sensor 320 that is fabricated according to an alternative embodiment of the method 11 of FIG. 1. For the sake of consistency and clarity, similar devices and features from FIGS. 2-7 are labeled the same in FIG. 8. One difference between the BSI image sensor device 320 and the BSI image sensor device 30 is that, instead of filling the openings 230-233 (shown in FIG. 5) with the substance 250 (shown in FIG. 6), these openings 230-233 are filled with air. In other words, the openings 230-233 are closed at the top, and the air that was in the openings 230-233 are "trapped" in the openings. This may be accomplished by tuning process parameters of the deposition process that forms the substance 280. Air has a refractive index of 1, which is less than the refractive index of the anti-reflective features 210A-210C. Thus, the BSI image sensor 320 is capable of achieving the same advantages discussed in association with the BSI image sensor 30 that is illustrated in FIGS. 2-7.

Figure 9:
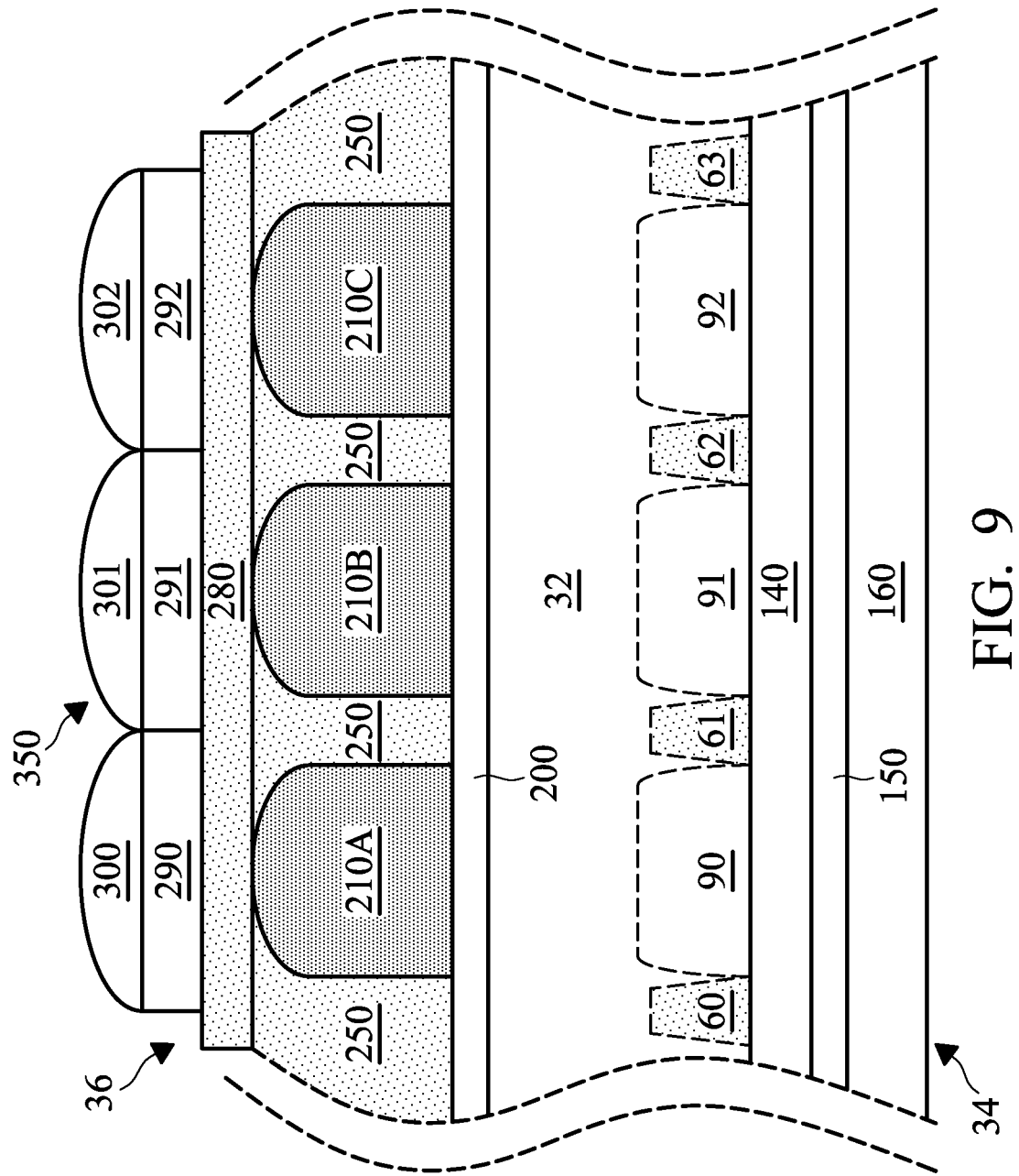
FIG. 9 is a diagrammatic fragmentary cross-sectional side view of a semiconductor device at a stage of fabrication in accordance with another alternative embodiment of the method illustrated in FIG. 1.

FIG. 9 is a diagrammatic fragmentary cross-sectional side view of a BSI image sensor 350 that is fabricated according to yet another alternative embodiment of the method 11 of FIG. 1. Again, for the sake of consistency and clarity, similar devices and features from FIGS. 2-7 are labeled the same in FIG. 9. One difference between the BSI image sensor device 350 and the BSI image sensor device 30 is that, the anti-reflective features 210A-210C are formed to have an approximately rounded or curved profile. Specifically, bottom surfaces of the anti-reflective features 210A-210C that are closer to the substrate 32 are substantially flat, but top surfaces of the anti-reflective features 210A-210C that are farther away from the substrate 32 are approximately rounded or curved. The rounded profile of the anti-reflective features 210A-210C may be achieved by tuning an etching recipe used in the etching process that forms the openings 230-233 shown in FIG. 5.

The BSI image sensor 350 achieves the same advantages discussed above in association with the BSI image sensor 30. In addition, the rounded or curved profile of the anti-reflective features 210A-210C each help focus incident radiation and direct such radiation to the intended radiation-sensing regions 90-92 therebelow. In other words, the rounded profiles of the anti-reflective features 210A-210C make them function in a somewhat similar manner as the micro lenses 300-302. As such, incident radiation can be sensed more effectively, thereby improving quantum efficiency. It is also understood that in another alternative embodiment, the characteristics of the BSI image sensor device 320 and the image sensor device 350 may be combined together. Stated differently, another alternative embodiment of a BSI image sensor device may have rounded anti-reflective features and may also be separated by openings that are filled with air instead of being filled with silicon oxide. For the sake of simplicity, this alternative embodiment is not illustrated.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus comprising an image sensor device that comprises:
    a substrate having a front side and a back side;
    an interconnect structure disposed over the front side of the substrate;
    a first radiation-detection device and a second radiation-detection device disposed in the substrate, the first and second radiation-detection devices being operable to detect radiation waves that enter the substrate through the back side;
    an isolation structure disposed between the first and second radiation-detection devices;
    an anti-reflective coating (ARC) layer having a first refractive index value disposed over the back side of the substrate, the ARC layer having a first ridge and a second ridge that are disposed over the first and second radiation-detection devices, respectively;
    a first lens disposed directly over the first ridge and having opposing ends extending beyond opposing sidewalls of the first ridge; and
    a second lens disposed directly over the second ridge and having opposing ends extending beyond opposing sidewalls of the second ridge,
    wherein the first and second ridges are separated by a substance having a second refractive index value that is less than the first refractive index value,
    wherein the substance is air,
    wherein the air extends uninterrupted from the first ridge to the second ridge,
    wherein the substance and the isolation structure are vertically aligned along a plane extending substantially perpendicular to the back side of the substrate, and
    wherein the first and second ridges extend through the substance from a first surface at an interface of the substance, the first surface disposed towards the substrate, to a second surface at an interface of the substance, the second surface opposite the first surface.

2. The apparatus of claim 1, wherein the image sensor device comprises a color filter layer disposed over the back side of the substrate, wherein the ARC layer is disposed between the color filter layer and the substrate.

3. The apparatus of claim 1, wherein the first ridge has a first surface and a second surface, the first surface of the first ridge being disposed opposite to the second surface of the first ridge, and wherein the first surface of the first ridge has an approximately curved profile and is disposed farther away from the substrate than the second surface of the first ridge.

4. The apparatus of claim 1, wherein the ARC layer comprises at least one of ultraviolet silicon nitride, silicon oxynitride, silicon carbide, silicon carbide nitride, titanium oxide, and hafnium oxide.

5. The apparatus of claim 1, wherein:
the first refractive index value is in a range from approximately 1.4 to approximately 3; and
the second refractive index value is in a range from approximately 1 to approximately 1.5.

6. The apparatus of claim 1, wherein the substance has a width that is in a range from approximately 0.05 microns to approximately 0.8 microns, the width being measured in a horizontal direction in which the first and second ridges are separated.

7. The apparatus of claim 6, wherein the first and second ridges are approximately aligned with the first and second radiation-detection devices in a vertical direction, respectively, the vertical direction being perpendicular to the horizontal direction.

8. The apparatus of claim 1, wherein the first surface is at an interface between the substance and a first dielectric layer disposed between the ARC layer and the substrate, and wherein the second surface is at an interface between the substance and a second dielectric layer disposed on the ARC layer opposite the first dielectric layer.

9. An apparatus comprising an image sensor device that comprises:
a substrate having a front surface and a back surface;
an interconnect structure disposed over the front surface of the substrate;
a plurality of radiation-sensing regions formed in the substrate, each of the radiation-sensing regions being operable to sense radiation projected toward the radiation-sensing region through the back surface;
a plurality of anti-reflective features formed over the back surface of the substrate, each of the anti-reflective features being approximately aligned to one of the radiation-sensing regions, each of the anti-reflective features being separated from adjacent anti-reflective features by a first material that has a lower refractive index than each of the anti-reflective features, wherein the first material is air, and wherein the air between a first of the plurality of anti-reflective features and a second of the plurality of anti-reflective features extends over more than one of the plurality of radiation-sensing regions;
a second material physically contacting a portion of each of the anti-reflective features and continuously extending to and physically contacting a color filter layer, the second material having a lower refractive index than each of the anti-reflective features,
wherein an anti-reflective feature of the plurality of anti-reflective features extends completely through the first material in a direction perpendicular to the back surface of the substrate; and
a plurality of lenses formed over the plurality of anti-reflective features, wherein each lens of the plurality of lenses is disposed over a feature of the plurality of anti-reflective features such that the lens extends beyond the respective feature in a direction parallel to the back surface of the substrate.

10. The apparatus of claim 9, wherein the color filter layer is formed over the back surface of the substrate, wherein the color filter layer and the substrate are interposed by the anti-reflective features.

11. The apparatus of claim 9, wherein the anti-reflective features each have an end portion that is approximately rounded.

12. The apparatus of claim 9, wherein:
the anti-reflective features each have an extinction coefficient that is less than approximately 0.2 and a first refractive index that is in a range from approximately 1.4 to approximately 3; and
the first material has a second refractive index that is in a range from approximately 1 to approximately 1.5.

13. The apparatus of claim 9, wherein each of the plurality of anti-reflective features extends from a dielectric layer to the second material disposed opposite the dielectric layer.

14. An apparatus comprising:
a back side illuminated image sensor, the back side illuminated image sensor including:
a substrate having a front surface and a back surface;
an interconnect structure disposed over the front surface of the substrate;
a first radiation-sensing region and a second radiation-sensing region disposed in the substrate adjacent the front surface, the first and second radiation-sensing regions operable to sense radiation projected toward the back surface of the substrate;
a first anti-reflective feature and a second antireflective feature disposed over the back surface of the substrate, the first and second antireflective features being separated by a first substance that has a lower refractive index than each of the first and second anti-reflective features, wherein the first substance is air, and wherein the air extends uninterrupted between the first anti-reflective feature and the second anti-reflective feature;
a second substance physically contacting a portion of the first and second anti-reflective features and continuously extending to and physically contacting a color filter layer, the second substance having the lower refractive index than each of the first and second anti-reflective features,
wherein the first and second anti-reflective features continuously extend through the first substance from a first surface at a first interface of the first substance to a second surface at a second interface of the first substance,
wherein the first surface of the first substance is disposed towards the substrate, and
wherein the second surface of the first substance is opposite the first surface of the first substance;
a first lens disposed directly over the first anti-reflective feature and extending beyond the first anti-reflective feature; and
a second lens disposed directly over the second anti-reflective feature and extending beyond the second anti-reflective feature.

15. The apparatus of claim 14, wherein the color filter layer is disposed over the back surface of the substrate.

16. The apparatus of claim 14, wherein the first and second anti-reflective features each have a top surface and a bottom surface that are substantially parallel with respect to the back surface of the substrate.

17. The apparatus of claim 16, wherein the first and second anti-reflective features each have opposing sidewall surfaces extending from the bottom surface to the top surface, the opposing sidewall surfaces being substantially parallel with respect to each other.

18. The apparatus of claim 14, wherein the first and second anti-reflective features each have a curved top surface and an opposing bottom surface with opposing sidewall surfaces extending from the bottom surface to the curved top surface, the opposing sidewall surfaces being substantially parallel with respect to each other.

19. The apparatus of claim 14, further comprising an isolation structure disposed between the first and second radiation-sensing regions, and wherein the first substance and the isolation structure are vertically aligned along a plane extending substantially perpendicular to the back surface of the substrate.

20. The apparatus of claim 14, wherein the first and second anti-reflective features each extend from a dielectric layer to the second substance disposed opposite the dielectric layer.

* * * * *